US010705915B2

(12) United States Patent
Matsuba et al.

(10) Patent No.: US 10,705,915 B2
(45) Date of Patent: Jul. 7, 2020

(54) EMBEDDED SYSTEM, PHOTOGRAPHING DEVICE AND REFRESH METHOD

(71) Applicant: Olympus Corporation, Hachioji-shi, Tokyo (JP)

(72) Inventors: Hiromi Matsuba, Hino (JP); Yasutaka Daishaku, Sagamihara (JP)

(73) Assignee: Olympus Corporation, Tokyo (JP)

( * ) Notice: Subject to any disclaimer, the term of this patent is extended or adjusted under 35 U.S.C. 154(b) by 210 days.

(21) Appl. No.: 15/663,752

(22) Filed: Jul. 30, 2017

(65) Prior Publication Data

US 2018/0032402 A1 Feb. 1, 2018

(30) Foreign Application Priority Data

Aug. 1, 2016 (JP) .................................. 2016-151256

(51) Int. Cl.
| | |
|---|---|
| *G06F 11/00* | (2006.01) |
| *G06F 11/14* | (2006.01) |
| *G06F 11/10* | (2006.01) |
| *G11C 29/52* | (2006.01) |
| *H04N 1/00* | (2006.01) |
| *G11C 29/04* | (2006.01) |
| *H04N 101/00* | (2006.01) |

(52) U.S. Cl.
CPC ...... *G06F 11/1417* (2013.01); *G06F 11/1048* (2013.01); *G06F 11/1068* (2013.01); *G11C 29/52* (2013.01); *H04N 1/00938* (2013.01); *G06F 2201/805* (2013.01); *G06F 2201/82* (2013.01); *G11C 2029/0409* (2013.01); *G11C 2029/0411* (2013.01); *H04N 2101/00* (2013.01)

(58) Field of Classification Search
CPC ............. G06F 11/1417; G06F 11/1469; G06F 11/1458; G06F 11/1441; G06F 9/4408; G06F 21/575; G06F 11/1666; G06F 11/00; G06F 11/14; G06F 11/1446; G06F 11/1456; G06F 3/065; H04L 41/082; G11C 29/00; G11C 29/4401
See application file for complete search history.

(56) References Cited

U.S. PATENT DOCUMENTS 5,325,532 A * 6/1994 Crosswy ............... G06F 9/4406
  713/100
8,627,141 B2 * 1/2014 Lambert ............. G06F 11/1417
  714/15

(Continued)

FOREIGN PATENT DOCUMENTS

JP 2009-026285 5/2009

*Primary Examiner* — Loan L. T. Truong
(74) *Attorney, Agent, or Firm* — John C. Pokotylo; Pokotylo Patent Services

(57) ABSTRACT

An embedded system includes: a first storage portion in which a boot program in a basic program stored in a flash memory is developed and stored; a second storage portion in which the basic program is developed and stored according to the boot program developed in the first storage portion; a first error correction circuit configured to perform error correction when reading the boot program; a third storage portion in which information based on an error correction result of the error correction circuit is stored; and a control portion configured to determine propriety of refresh processing on the boot program based on the information based on the error correction result stored in the third storage portion.

11 Claims, 5 Drawing Sheets

(56) References Cited

U.S. PATENT DOCUMENTS

| | | | |
|---|---|---|---|
| 9,268,941 B1* | 2/2016 | Akdemir | G06F 9/4418 |
| 10,146,553 B2* | 12/2018 | Lee | G06F 9/4408 |
| 10,437,490 B2* | 10/2019 | Suzuki | G06F 3/0635 |
| 10,445,007 B1* | 10/2019 | Hagen | G06F 3/0659 |
| 2004/0133771 A1* | 7/2004 | King | G06F 8/65 |
| | | | 713/100 |
| 2005/0129285 A1* | 6/2005 | Mino | G06K 9/00221 |
| | | | 382/115 |
| 2005/0240756 A1* | 10/2005 | Mayer | G06F 9/4418 |
| | | | 713/2 |
| 2006/0041711 A1* | 2/2006 | Miura | G11C 7/20 |
| | | | 711/103 |
| 2008/0201661 A1* | 8/2008 | Haynes | G06F 3/0607 |
| | | | 715/810 |
| 2008/0263345 A1* | 10/2008 | Booth | G06F 21/572 |
| | | | 713/2 |
| 2009/0172467 A1* | 7/2009 | Araki | G06F 11/1068 |
| | | | 714/6.12 |
| 2009/0254776 A1* | 10/2009 | Gonzalez | G06F 11/1068 |
| | | | 714/6.12 |
| 2010/0211824 A1* | 8/2010 | Agrawal | G06F 11/0706 |
| | | | 714/23 |
| 2011/0016302 A1* | 1/2011 | Amou | G06F 11/1417 |
| | | | 713/2 |
| 2011/0043621 A1* | 2/2011 | Terada | G01N 21/8851 |
| | | | 348/135 |
| 2011/0161647 A1* | 6/2011 | Sohn | G06F 9/4401 |
| | | | 713/2 |
| 2011/0283051 A1* | 11/2011 | Lieber | G06F 11/1417 |
| | | | 711/103 |
| 2012/0054541 A1* | 3/2012 | Byom | G06F 11/0793 |
| | | | 714/6.13 |
| 2013/0262612 A1* | 10/2013 | Langas | G06F 3/0605 |
| | | | 709/211 |
| 2013/0262848 A1* | 10/2013 | Chan | G06F 8/65 |
| | | | 713/2 |
| 2013/0326206 A1* | 12/2013 | Lueck | G06F 1/32 |
| | | | 713/2 |
| 2014/0075093 A1* | 3/2014 | Wiesner | G11C 29/76 |
| | | | 711/103 |
| 2014/0281144 A1* | 9/2014 | Suzuki | G06F 12/0246 |
| | | | 711/103 |
| 2015/0039876 A1* | 2/2015 | Baratam | G06F 9/4401 |
| | | | 713/2 |
| 2015/0074461 A1* | 3/2015 | Yu | G06F 11/1417 |
| | | | 714/36 |
| 2015/0106548 A1* | 4/2015 | Dubois | G06F 12/0284 |
| | | | 711/103 |
| 2015/0170753 A1* | 6/2015 | Nitta | G11C 16/16 |
| | | | 365/185.11 |
| 2015/0277930 A1* | 10/2015 | Sarangdhar | G06F 21/575 |
| | | | 713/2 |
| 2016/0011878 A1* | 1/2016 | Chandra | G06F 11/1417 |
| | | | 711/103 |
| 2016/0055069 A1* | 2/2016 | Jeansonne | G06F 3/0619 |
| | | | 714/15 |
| 2016/0154700 A1* | 6/2016 | Tian | G06F 12/0653 |
| | | | 714/15 |
| 2017/0052854 A1* | 2/2017 | Yang | G06F 11/1469 |
| 2018/0039546 A1* | 2/2018 | Lambert | G06F 11/0793 |
| 2018/0075236 A1* | 3/2018 | Kwon | G06F 21/44 |
| 2018/0239896 A1* | 8/2018 | Kato | G06F 12/14 |

* cited by examiner

… (1) …

EMBEDDED SYSTEM, PHOTOGRAPHING DEVICE AND REFRESH METHOD

CROSS REFERENCE TO RELATED APPLICATION

This application claim is benefit of Japanese Application No. 2016-151256 in Japan on Aug. 1, 2016, the contents of which are incorporated by this reference.

BACKGROUND OF THE INVENTION

1. Field of the Invention

The present invention relates to an embedded system operated according to a program stored in a flash memory, a photographing device and a refresh method.

2. Description of the Related Art

In recent years, a portable device (photographing device) with a photographing function such as a digital camera has been in widespread use. In many photographing devices of this kind, an embedded system is adopted and various kinds of functions are realized by a program. The program is stored in a nonvolatile recording medium, a NAND type flash memory for example. A CPU built into the photographing device enables execution of the program by reading the program stored in the flash memory and developing the program in a DRAM (dynamic RAM) or the like.

The program is booted by reading and developing the program stored in the flash memory by a start program stored in a mask ROM. Upon booting, the start program reads a boot program stored in a predetermined area of the flash memory first, and develops the program in a built-in RAM. Thereafter, the boot program developed in the built-in RAM is executed and a remaining part of the program is developed in a DRAM.

Incidentally, in a NAND type flash memory, since a read voltage is applied also to an unselected memory cell from a word line, a read disturb phenomenon that an electron is gradually injected to a floating gate occurs. Due to read disturb, a threshold voltage of data read is changed, read errors are increased, and reliability of read data is lowered. In order to prevent reliability decline of the data due to the read disturb, rewrite processing, that is, refresh processing of returning the threshold voltage to an original state needs to be appropriately performed to the memory cell.

Note that refresh in the NAND type flash memory is performed by reading correct data and writing back the read data. In the NAND type flash memory, since erasure processing needs to be performed in block units upon the write-back, the refresh also needs to be performed in the block units.

Japanese Patent Application Laid-Open Publication No. 2009-26285 discloses a technology of periodically performing a refresh operation to an entire area using a random number.

Incidentally, together with a CPU, a mask ROM and a built-in RAM are often made into an integrated circuit such as an ASIC (application specific integrated circuit). Both of the mask ROM and the built-in RAM loaded on the ASIC are a memory of a limited capacity of about 128 KB for example. Therefore, a start program describing an instruction for exclusively reading a boot program, storing the boot program in the built-in RAM and causing the boot program to be executed is stored in the mask ROM, and the boot program developed and stored in the built-in RAM is used to read a remaining part of the program from a flash memory and develop the remaining part in a DRAM.

Note that the refresh in the NAND type flash memory needs to be performed in the block units as described above, and in order to refresh the boot program, normal data in the block unit of a relatively large size needs to be read, stored and held. In addition, for the program developed in the DRAM, refresh processing can be performed.

SUMMARY OF THE INVENTION

An embedded system according to one aspect of the present invention includes: a first storage portion in which a boot program in a basic program stored in a flash memory is developed and stored; a second storage portion in which the basic program is developed and stored according to the boot program developed in the first storage portion; a first error correction circuit configured to perform error correction when reading the boot program; a third storage portion in which information based on an error correction result of the first error correction circuit is stored; and a control portion configured to determine propriety of refresh processing on the boot program based on the information based on the error correction result stored in the third storage portion.

A photographing device according to one aspect of the present invention includes: an image pickup portion; a first storage portion in which a boot program in a basic program for image pickup stored in a flash memory is developed and stored; a second storage portion in which the basic program is developed and stored according to the boot program developed in the first storage portion; a first error correction circuit configured to perform error correction when reading the boot program; a third storage portion in which information based on an error correction result of the first error correction circuit is stored; a control portion configured to determine propriety of refresh processing on the boot program based on the information based on the error correction result stored in the third storage portion; and a second error correction circuit configured to perform error correction on data read from the flash memory and developed and stored in the second storage portion, and the control portion is operated according to a boot refresh program in the basic program developed in the second storage portion, determines the propriety of the refresh processing according to the information based on the error correction result of the first error correction circuit, and upon the refresh processing, reads data needed for refresh of the boot program from the flash memory, develops and stores the data in the second storage portion, and writes back the developed and stored data to the flash memory.

A refresh method according to one aspect of the present invention includes: a procedure of developing and storing a boot program in a basic program stored in a flash memory in a first storage portion; a procedure of performing first error correction processing when reading the boot program; a procedure of storing information based on an error correction result in the first error correction processing in a third storage portion; a procedure of developing and storing the basic program in a second storage portion according to the boot program developed in the first storage portion; and a refresh procedure of determining propriety of refresh processing on the boot program based on the information based on the error correction result stored in the third storage portion.

The above and other objects, features and advantages of the invention will become more clearly understood from the following description referring to the accompanying drawings.

DETAILED DESCRIPTION OF THE PREFERRED EMBODIMENT

Hereinafter, an embodiment of the present invention will be described in detail with reference to the drawings.

Figure 1:
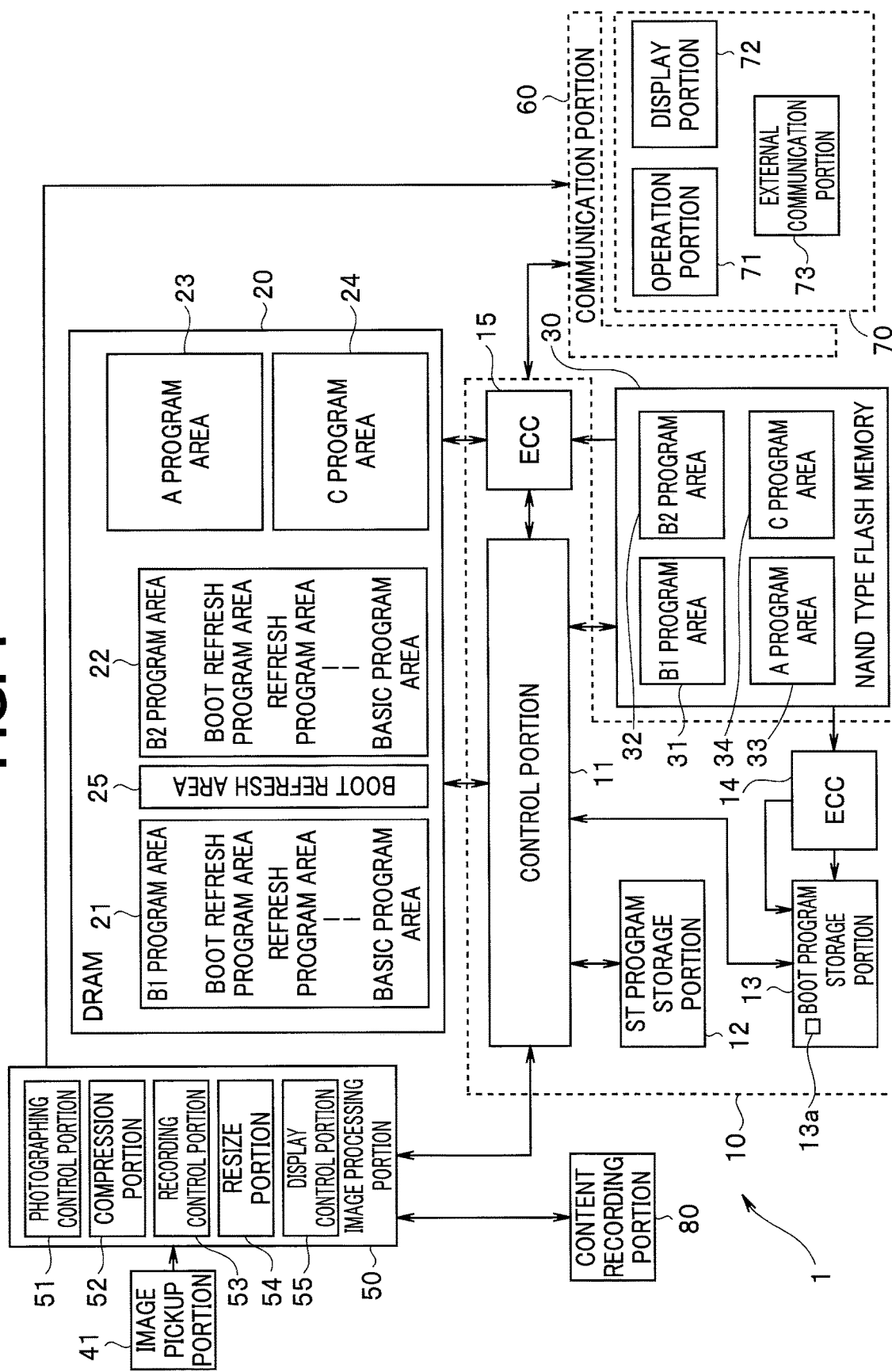
FIG. 1 is a block diagram illustrating a circuit configuration of a photographing device loaded with an embedded system relating to one embodiment of the present invention.

FIG. 1 is a block diagram illustrating a circuit configuration of a photographing device loaded with an embedded system relating to one embodiment of the present invention.

For a photographing device 1 in FIG. 1, whole is controlled by a control portion 11. The control portion 11 may be configured by a processor such as a CPU, and configured on an integrated circuit 10 such as an ASIC. Note that, on the integrated circuit 10, other than the control portion 11, an ST program storage portion 12, a boot program storage portion 13, and error correction circuits (referred to as ECC, hereinafter) 14 and 15 may be loaded. Note that the ST program storage portion 12 may be configured by a mask ROM for example, and the boot program storage portion 13 may be configured by a built-in RAM. The control portion 11 realizes a camera function by reading and executing a program developed and stored in a DRAM 20.

The photographing device 1 includes an image pickup portion 41 configured by an image pickup device such as a CCD or a CMOS sensor. An optical image of an object from a taking lens not shown in the figure is image-formed on an image pickup surface of the image pickup device configuring the image pickup portion 41. Drive of the image pickup portion 41 is controlled by a photographing control portion 51 of an image processing portion 50. The photographing control portion 51 outputs a drive signal of the image pickup device to the image pickup portion 41, and fetches an image signal obtained by the image pickup device photoelectrically converting the optical image.

The image processing portion 50 is controlled by the control portion 11, and performs not only processing relating to image pickup but also image signal processing, recording and reproduction processing, display processing and the like. That is, for example, the image processing portion 50 performs predetermined signal processing, for example, chrominance signal generation processing, matrix transformation processing, and other various kinds of digital processing, on the image signal obtained by photoelectric conversion of the image pickup portion 41. In addition, a compression portion 52 of the image processing portion 50 performs encoding processing on image pickup data and obtains compressed image data, sound data and the like, when recording the image signal, a sound signal and the like.

A recording control portion 53 is controlled by the control portion 11, and controls recording and reproduction to a content recording portion 80. As the content recording portion 80, an IC memory for example can be adopted. The control portion 11 can control the recording control portion 53, give a picked-up image signal-processed and compressed by the image processing portion 50 to the content recording portion 80 and cause the image to be recorded. A resize portion 54 is controlled by the control portion 11, and can resize the picked-up image and reduce an image size.

A display control portion 55 executes various kinds of processing relating to display. The display control portion 55 is controlled by the control portion 11, and controls the display of a display portion 72. The display portion 72 includes a display screen such as an LCD, and displays an image supplied from the display control portion 55. For example, the control portion 11 can also control the display control portion 55 and cause live view display, rec view display, reproduction display and the like to be displayed on the display screen of the display portion 72.

In recent years, as a photographing device, a lens type camera not including a display portion of the picked-up image and having only photographing and recording functions is sometimes adopted. The lens type camera of this kind is generally attached to a smartphone, a tablet PC or the like, and photographing is controlled with the attached smartphone, tablet PC or the like as a control device. In addition, a control device such as the smartphone or the tablet PC like this also functions as an image pickup display device configured to display the picked-up image from the lens type camera.

A broken line of an operation device portion 70 in FIG. 1 indicates that a component inside the broken line may be realized by an external device such as a smartphone and may be built into the photographing device in FIG. 1. In a case that the operation device portion 70 is configured by the external device, the photographing device 1 includes a communication portion 60, and the communication portion 60 enables transfer of information between the photographing device 1 and the operation device portion 70 by a wire or radio. Note that, in the case that the operation device portion 70 is built into the photographing device 1 in FIG. 1, the communication portion 60 configured to perform such communication is not needed.

The operation device portion 70 includes an operation portion 71, the display portion 72 and an external communication portion 73. The operation portion 71 can be configured by a switch or a button not shown in the figure for example, and can supply an operation signal based on a user operation to the operation portion 71 to the control portion 11 inside the integrated circuit 10.

The display portion 72 displays the picked-up image, a menu and the like. Note that, in the case that the display portion 72 is built into the photographing device 1 in FIG. 1, the display portion 72 is controlled by the display control portion 55. In addition, in the case that the display portion 72 is configured by the external device, the display portion 72 is controlled by the external device.

The external communication portion 73 can communicate with the external device and transmit and receive information. For example, the external communication portion 73 can also transfer the information with a cloud through a line such as the Internet. Note that, in the case that the external communication portion 73 is built into the photographing device 1 in FIG. 1, the external communication portion 73 is controlled by the control portion 11. In addition, in the case that the external communication portion 73 is configured by the external device, the external communication portion 73 is controlled by the external device.

In the present embodiment, the photographing device 1 includes a NAND type flash memory 30. The flash memory 30 includes a B1 program area 31 for storing a B1 program, a B2 program area 32 for storing a B2 program, an A program area 33 for storing an A program, and a C program area 34 for storing a C program.

In the present embodiment, the B1 and B2 programs are mutually identical programs, and are basic programs for achieving basic functions in the photographing device 1. A boot program is also included in the B1 and B2 programs respectively. The A program is an expansion program for achieving all the functions other than the functions by the B1 and B2 programs among the functions of the photographing device 1. In addition, the C program is a repair program for downloading a program from the external device not shown in the figure.

The B1 and B2 programs include a refresh program part for refreshing content of the B1, B2 and A programs. Further, in the present embodiment, the B1 and B2 programs include a part of a refresh program for the boot program (referred to as a boot refresh program, hereinafter) for refreshing the content of the boot program in the B1 and B2 programs. That is, the B1 and B2 programs include the boot program, the boot refresh program, the refresh program and the basic program for realizing the basic functions of the photographing device 1.

The respective programs stored in the flash memory 30 are developed and stored in the DRAM 20. That is, the DRAM 20 includes a B1 program area 21 configured to store data for which a program part excluding the boot program in the B1 program is developed and a B2 program area 22 configured to store data for which a program part excluding the boot program in the B2 program is developed. In addition, the DRAM 20 includes an A program area 23 configured to store data for which the A program is developed and a C program area 24 configured to store data for which the C program is developed.

An ECC 15 is controlled by the control portion 11, is supplied with the data read from the flash memory 30, executes error correction processing, supplies the data after the error correction processing to the DRAM 20 and causes the data to be stored. In addition, the ECC 15 supplies information based on an error correction result such as information on a number of errors corrected by the error correction processing to the control portion 11.

The refresh program is the program for performing refresh processing of the B1, B2 and A programs, and is for writing back the data in block units error-corrected by the ECC 15 and developed in the DRAM 20, that is, normal data not including the errors, to the B1 and B2 program areas 31 and 32 or the A program area 33.

In the present embodiment, the boot refresh program is for refreshing the boot program not developed in the DRAM 20 upon normal activation. The boot refresh program is described so as to perform boot refresh processing of reading the data (referred to as leading block data, hereinafter) of a block (referred to as a leading block, hereinafter) including a boot program part stored in the B1 program area 31 or the B2 program area 32, correcting the errors, then developing the data in the DRAM 20, and writing back the leading block data developed in the DRAM 20 to the leading block including the boot program part in the B1 and B2 program areas 31 and 32.

Note that the DRAM 20 includes a boot refresh area 25 for storing the leading block data after error correction.

The ST program storage portion 12 in the integrated circuit 10 is configured by a mask ROM or the like, and a start (ST) program is stored. The ST program is a program for reading the boot program part in the B1 and B2 programs stored in the flash memory 30 when activating the photographing device 1. The ECC 14 is controlled by the control portion 11, is supplied with the boot program in the B1 and B2 programs, and performs the error correction processing using an error correction code added to the program part. That is, the control portion 11 reads the boot program in the B1 and B2 programs, performs the error correction processing, and stores a normal boot program with no errors in the boot program storage portion 13, by executing the ST program.

The boot program storage portion 13 is a built-in RAM for example loaded in the integrated circuit 10. The boot program storage portion 13 has a capacity needed for developing and storing the boot program part in the B1 and B2 programs in the flash memory 30.

In the present embodiment, the boot program storage portion 13 includes a register 13a which is an area configured to store a refresh flag (also referred to as an RF flag, hereinafter) indicating necessity and unnecessity of the refresh. The ECC 14 supplies the information on the number of the errors corrected by the error correction processing to the control portion 11. The control portion 11 turns the RF flag in the register 13a to "1" when the number of the generated errors becomes equal to or larger than a predetermined threshold (referred to as a refresh determination threshold, hereinafter). Note that, in the register 13a, not only the RF flag but also the information based on the error correction result, such as the information on an error generation number may be stored. For example, the control portion 11 may store the information on the error generation number instead of the RF flag.

The boot refresh program determines whether or not to perform the boot refresh processing according to a state of the RF flag in the register 13a inside the boot program storage portion 13. For example, the boot refresh processing may be executed in the case that the error number of the generated is equal to or larger than the refresh determination threshold. Note that the boot refresh program is executed by the control portion 11.

Figure 2:
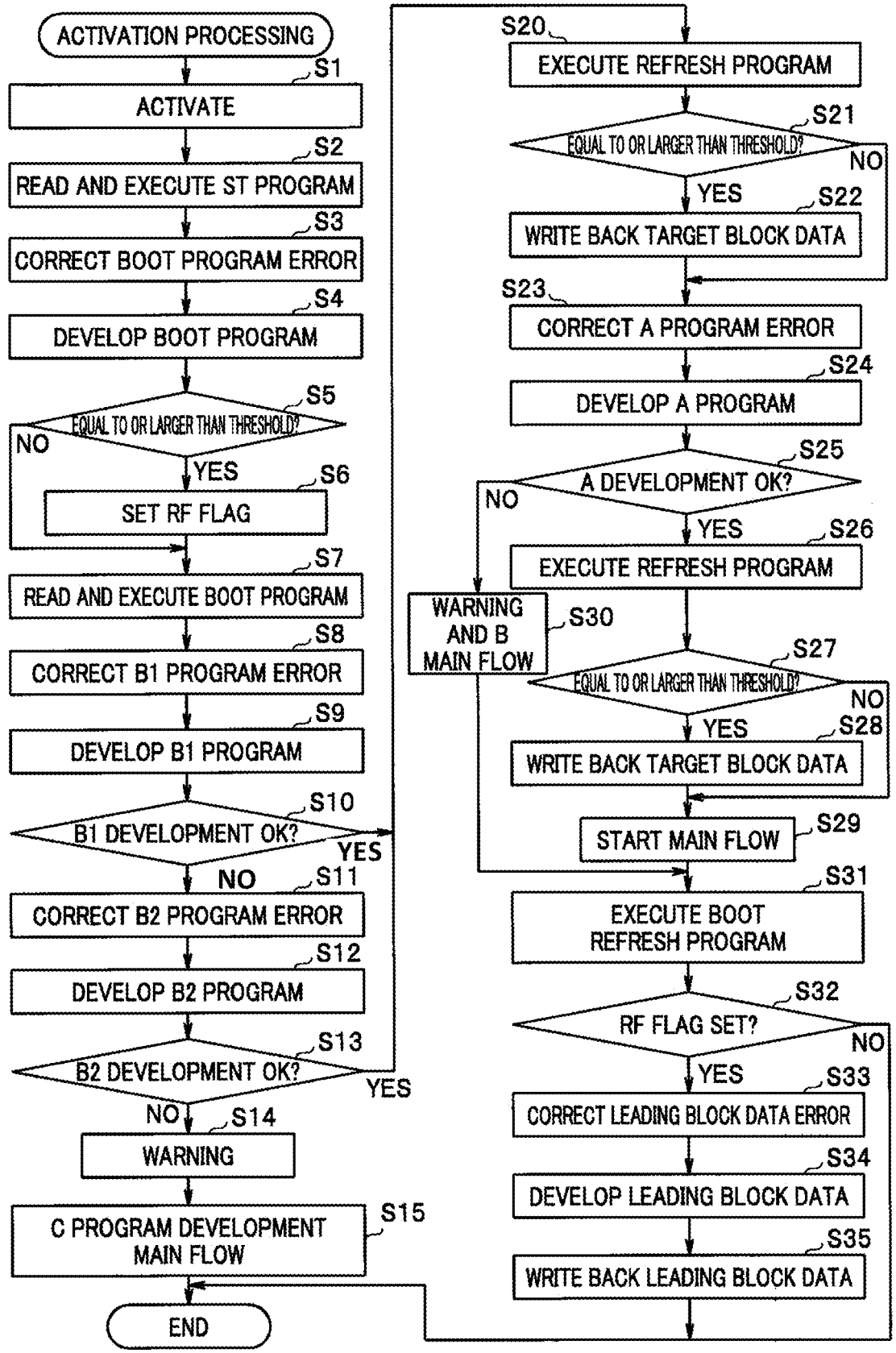
FIG. 2 is a flowchart for describing activation processing in the embodiment.
Figure 3:
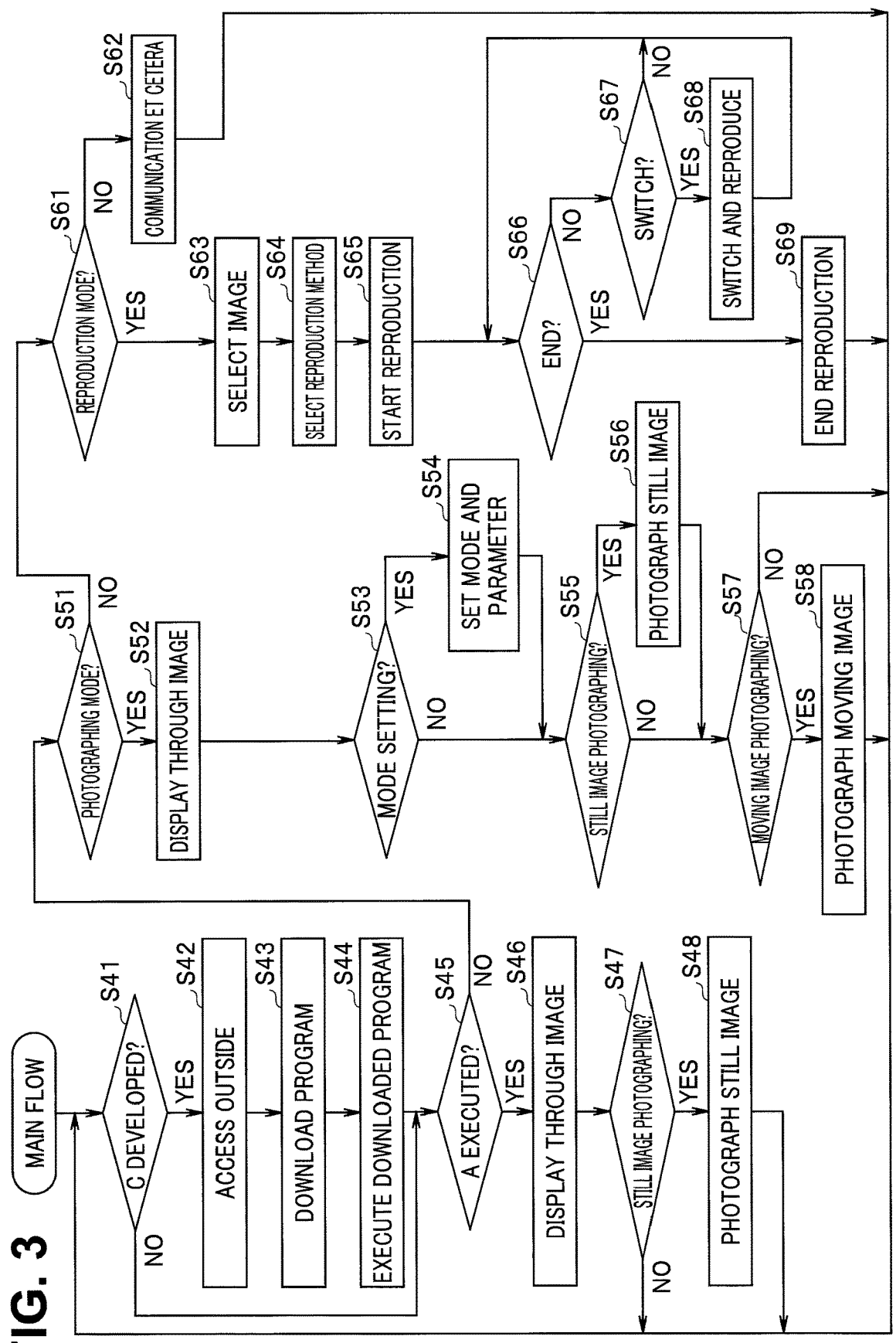
FIG. 3 is a flowchart illustrating one example of a main flow.

Next, an effect of the embodiment configured in this way will be described with reference to FIG. 2 and FIG. 3. FIG. 2 is a flowchart for describing activation processing in the present embodiment. FIG. 3 is a flowchart illustrating one example of a main flow.

When power is supplied, the control portion 11 starts the activation processing in step S1. The control portion 11 reads and executes the ST program stored in the ST program storage portion 12 (step S2). The control portion 11 reads the boot program in a predetermined area (leading block) of the B1 program area 31 of the flash memory 30 according to the ST program. The boot program is subjected to the error correction processing by the ECC 14 (step S3). The control portion 11 stores the normal boot program not including the errors after error correction in the boot program storage portion 13 (step S4).

In the present embodiment, the ECC 14 supplies the information on an error correction number to the control portion 11. The control portion 11 determines whether or not the error correction number is equal to or larger than the threshold (step S5), and in the case of being equal to or larger than the threshold, sets the RF flag indicating that the refresh is needed, and stores the RF flag in the register 13a inside the boot program storage portion 13 (step S6). Note that, by setting the RF flag in step S6, it can be determined that the refresh of the boot program is needed when executing the boot refresh program to be described later.

Next, the control portion 11 reads and executes the boot program stored in the boot program storage portion 13 in step S7. The control portion 11 initializes the DRAM 20 and reads the data excluding the boot program part in the B1 program area 31 of the flash memory 30, according to the boot program. The read data is subjected to the error correction processing (B1 program error correction) by the ECC 15 (step S8). The control portion 11 stores a normal B1 program not including the errors after the error correction in the B1 program area 21 of the DRAM 20 (step S9).

The control portion 11 determines whether the B1 program is normally developed in the DRAM 20 and can be executed, in step S10. When developing the B1 program, in the case that the errors exceeding the number of the errors correctable by the ECC 15 are generated or the like, the B1 program is not normally developed, and cannot be normally executed in the control portion 11. In the present embodiment, in the case that the B1 program is not normally developed, the B2 program is developed instead of the B1 program.

That is, the control portion 11 reads the data excluding the boot program part of the B2 program area 32 of the flash memory 30 according to the boot program, in step S11. The read data is subjected to the error correction processing (B2 program error correction) by the ECC 15. The control portion 11 stores a normal B2 program not including the errors after the error correction in the B2 program area 22 of the DRAM 20 (step S12).

In the present embodiment, the B1 program and the B2 program are the programs of the mutually identical content, and realize the basic functions of the embedded system. Influence of read disturb that occurs in the NAND type flash memory 30 is different at each position inside the memory, and even in the case that a failure occurs in development and execution of the B1 program due to the errors or the like, the B2 program can be normally developed and executed sometimes. The basic program that realizes the basic functions of the embedded system is configured including such redundancy, and certainty of activation can be improved for the basic functions of the embedded system.

Note that the control portion 11 determines whether or not the B2 program is normally developed in the DRAM 20 and can be executed, in step S13. When developing the B2 program, in the case that the errors exceeding the number of the errors correctable by the ECC 15 are generated or the like, the B2 program is not normally developed, and cannot be normally executed in the control portion 11. In the present embodiment, in the case that both of the B1 and B2 programs are not normally developed, warning is generated in step S14. For example, the warning may be the warning that displays display indicating that both of the B1 and B2 programs cannot be activated.

After generating the warning, the control portion 11 reads the C program from the C program area 34 of the flash memory 30 and develops the C program in the C program area 24 of the DRAM 20, in step S15. Then, the control portion 11 starts the main flow based on the C program.

On the other hand, in the case of determining that the B1 program or the B2 program is normally developed in step S10 or step S13, the control portion 11 shifts processing to step S20, accesses the B1 program area 21 in the case that the B1 program is developed and executed, or accesses the B2 program area 22 in the case that the B2 program is developed and executed, and executes the refresh program stored in a refresh program area.

The control portion 11 determines whether or not the error correction number of the error correction processing of the ECC 15 is equal to or larger than the predetermined threshold, according to the refresh program (step S21). The control portion 11 determines that the refresh processing of the B1 and B2 programs is needed in the case that the error correction number by the ECC 15 is equal to or larger than the predetermined threshold, and determines that the refresh processing of the B1 and B2 programs is not needed in the case that the error correction number by the ECC 15 does not reach the predetermined threshold, for example.

In the case of determining that the refresh processing of the B1 and B2 programs is needed, the control portion 11 writes back the normal B1 and B2 programs not including the errors and stored in the B1 program area 21 or the B2 program area 22 of the DRAM 20 to both of the B1 program area 31 and the B2 program area 32 of the NAND type flash memory 30, in step S22. In this way, the refresh processing of the B1 and B2 programs in the B1 and B2 program areas 31 and 32 is performed.

Next, the control portion 11 shifts the processing to step S23, and reads the A program from the A program area 23. The control portion 11 supplies the A program to the ECC 15, and causes the error correction processing to be performed. The control portion 11 stores a normal A program not including the errors after the error correction in the A program area 23 of the DRAM 20 (step S24).

Next, the control portion 11 determines whether or not the A program is normally developed in the DRAM 20 and can be executed, in step S25. When developing the A program, in the case that the errors exceeding the number of the errors correctable by the ECC 15 are generated or the like, the A program is not normally developed, and cannot be normally executed in the control portion 11. In the present embodiment, in the case of determining that the A program is not normally developed in step S25, the warning is generated in step S30, and the processing is shifted to the main flow of only the basic functions by the B1 or B2 program. For example, the warning may be the warning that displays the display indicating that only the basic functions can be executed.

When the A program is normally developed in step S25, the control portion 11 shifts the processing to step S26. The control portion 11 accesses the B1 program area 21 in the case that the B1 program is developed and executed, or accesses the B2 program area 22 in the case that the B2 program is developed and executed, and executes the refresh program stored in the refresh program area.

The control portion 11 determines whether or not the error correction number of the error correction processing of the ECC 15 when developing the A program is equal to or larger than the predetermined threshold, according to the refresh program (step S27). The control portion 11 determines that the refresh processing of the A program is needed in the case that the error correction number by the ECC 15 is equal to or larger than the predetermined threshold, and determines that the refresh processing of the A program is not needed in the case that the error correction number by the ECC 15 does not reach the predetermined threshold, for example.

In the case of determining that the refresh processing of the A program is needed, the control portion 11 writes back the normal A program not including the errors and stored in the A program area 23 of the DRAM 20 to the A program area 33 of the NAND type flash memory 30, in step S28. In this way, the refresh processing of the A program in the A program area 33 is performed. Next, the control portion 11 shifts the processing to step S29, and executes the main flow of the embedded system, based on the B1 or B2 program and the A program.

When the main flow is started in step S29 or S30, the control portion 11 starts the boot refresh processing. That is, the control portion 11 accesses the B1 program area 21 in the case that the B1 program is developed and executed, or accesses the B2 program area 22 in the case that the B2 program is developed and executed, and executes the boot refresh program stored in a boot refresh program area, in step S31. In addition, in the case of executing the boot refresh program, the control portion 11 may cause the display portion 72 to display warning display indicating that the boot program is subjected to the refresh processing.

The control portion 11 determines whether or not the RF flag indicating that the refresh processing of the boot program is needed is set, according to the boot refresh program (step S32). The control portion 11 confirms the content of the register 13a in the boot program storage portion 13, and determines whether or not the refresh processing of the boot program is needed. For example, depending on the content of the register 13a, the control portion 11 determines that the refresh processing of the boot program is needed when it is indicated that the error correction number by the ECC 14 is equal to or larger than the predetermined threshold, and determines that the refresh processing of the boot program is not needed when it is indicated that the error correction number by the ECC 14 does not reach the predetermined threshold.

In the case of determining that the refresh processing of the boot program is needed, the control portion 11 reads the leading block data in the B1 program area 31 or the leading block data in the B2 program area 32, and causes the error correction processing to be performed by the ECC 15, in step S33. The control portion 11 stores normal leading block data not including the errors after the error correction in the boot refresh area 25 of the DRAM 20 (step S34). Next, the control portion 11 writes back the normal leading block data not including the errors and stored in the boot refresh area 25 to the leading block of the B1 program area 31 and the B2 program area 32 of the NAND type flash memory 30 (step S35).

In this way, the refresh processing of the boot program included in the leading block in the B1 and B2 program areas 31 and 32 is performed.

Note that, while an example of executing the boot refresh processing after the main flow is started is indicated in FIG. 2, the boot refresh processing may be executed at any timing after the boot refresh program is developed, and may be executed immediately before turning off the power, for example. In addition, similarly, while an example of executing the refresh processing of the B1, B2 and A programs before the main flow is started is indicated in FIG. 2, the refresh processing may be executed at any timing after the refresh program is developed.

FIG. 3 illustrates one example of the main flow. The control portion 11 determines whether or not the C program is developed in the DRAM 20 and the main flow based on the C program is being executed first in the main flow (step S41). In the case that the B1 and B2 programs are not developed and not executed, the basic functions of the embedded system cannot be realized. In this case, the C program is executed in step S15 in FIG. 2. The C program has a function of downloading a predetermined program such as the basic program from outside and causing the program to be executed. The control portion 11 accesses the external device through the Internet or the like in step S42, and downloads the predetermined program (step S43). The control portion 11 executes the downloaded program (step S44).

Note that the control portion 11 may write the downloaded program in the B1 and B2 program areas 31 and 32 of the flash memory 30 and update the B1 and B2 programs.

The control portion 11 determines whether or not the A program is executed in step S45. In the case that the A program is not executed and only the B1 or B2 program or the basic program downloaded by the C program is executed, the embedded system cannot realize the expanded functions and only the basic functions are realized. The control portion 11 displays a through image in step S46. In the case that only a through image display and still image photographing function are realized as the basic function, the control portion 11 determines whether or not a still image photographing operation is performed in step S47, and photographs a still image when the still image photographing operation is performed (step S48).

In the case that the A program is developed and executed, the control portion 11 shifts from step S45 to step S51, determines whether or not a photographing mode is specified, and determines whether or not a reproduction mode is specified in step S61. In the case that the photographing mode is specified, the control portion 11 displays the through image in step S52. The control portion 11 determines whether or not a setting operation of a mode, a parameter and the like is performed in step S53, and in the case that the operation is performed, sets the mode and the parameter in step S54.

The control portion 11 determines whether or not still image photographing is instructed in step S55, and determines whether or not moving image photographing is instructed in step S57. The control portion 11 photographs the still image in step S56 when the still image photographing operation is performed, and the control portion 11 photographs a moving image in step S58 when a moving image photographing operation is performed.

In the case that the reproduction mode is specified, the control portion 11 shifts the processing from step S61 to step S63, and performs image selection of a reproduction image. The control portion 11 selects a reproduction method in step S64, and starts reproduction in step S65. The control portion 11 determines whether or not end of the reproduction is instructed in step S66, and determines whether or not switching of the reproduction method or the reproduction image is instructed in step S67. When the switching of the reproduction method or the reproduction image is instructed, the control portion 11 shifts the processing from step S67 to step S68, performs the switching according to the instruction and then continues the reproduction. In addition, when the reproduction end is instructed, the control portion 11 ends the reproduction in step S69.

Note that, in the case that the reproduction mode is not specified, the control portion 11 shifts the processing from step S61 to step S62, and executes the processing of the communication and the like.

In this way, in the present embodiment, the RF flag for determining the necessity and unnecessity of the refresh of the boot program is stored in the boot program storage portion, and according to the boot refresh program described in the basic program, the content of the RF flag is confirmed, and in the case that the refresh of the boot program is needed, the refresh processing of developing the leading block data including the boot program in the DRAM and writing back the leading block data is executed. Thus, even in the case of storing the boot program in the built-in RAM or the like not having the capacity capable of storing the leading block data, the refresh processing of the boot program is possible. In addition, in the present embodiment, all the functions of the embedded system are realized by the basic program and the expansion program, the basic program has redundancy, and the certainty of the activation of the embedded system can be improved.

(Modification)

Figure 4:
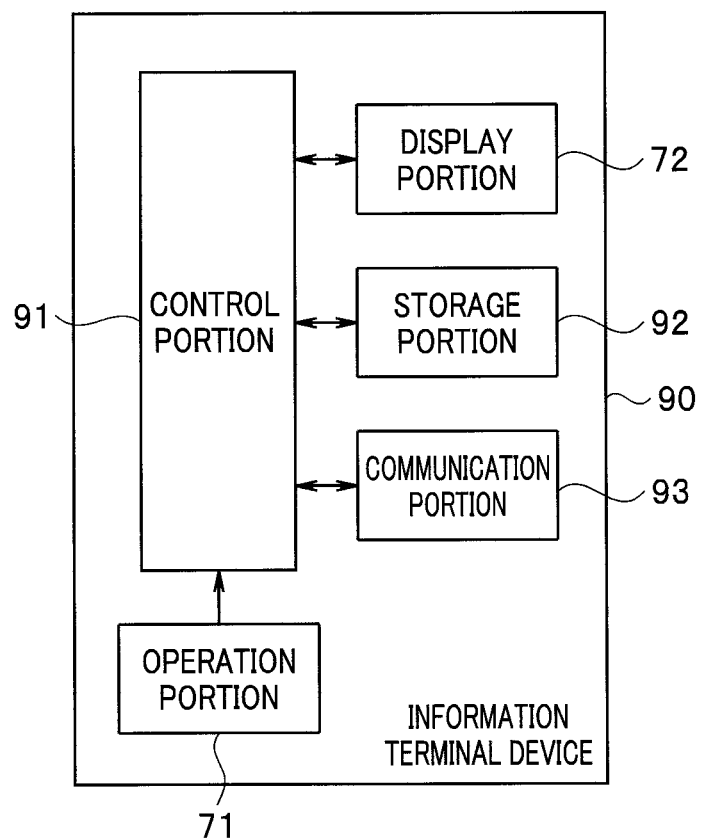
FIG. 4 is a block diagram illustrating a modification.

FIG. 4 is a block diagram illustrating an information terminal device adopted in the modification. The present modification is an example of providing the operation device portion 70 in the external device, and an example of adopting an information terminal device 90 illustrated in FIG. 4 as the external device is illustrated. The other configuration of the photographing device 1 is similar to FIG. 1. As the information terminal device 90, for example, a smartphone or a tablet PC can be adopted.

The information terminal device 90 includes a control portion 91. The control portion 91 can be configured by a processor such as a CPU not shown in the figure, and controls the respective portions of the information terminal device 90. The information terminal device 90 includes a storage portion 92, and various kinds of information and the program or the like used in the control portion 91 are stored in the storage portion 92. The information terminal device 90 includes the operation portion 71 and the display portion 72. The operation portion 71 and the display portion 72 have the functions similar to the functions of the operation portion 71 and the display portion 72 in FIG. 1.

The information terminal device 90 includes a communication portion 93. The communication portion 93 has the two functions that are the function of communicating with the communication portion 60 in FIG. 1 and the function of the external communication portion 73. That is, the communication portion 93 is controlled by the control portion 91, and can transfer the information by communicating with the photographing device 1 and also communicating with the external device.

Figure 5:
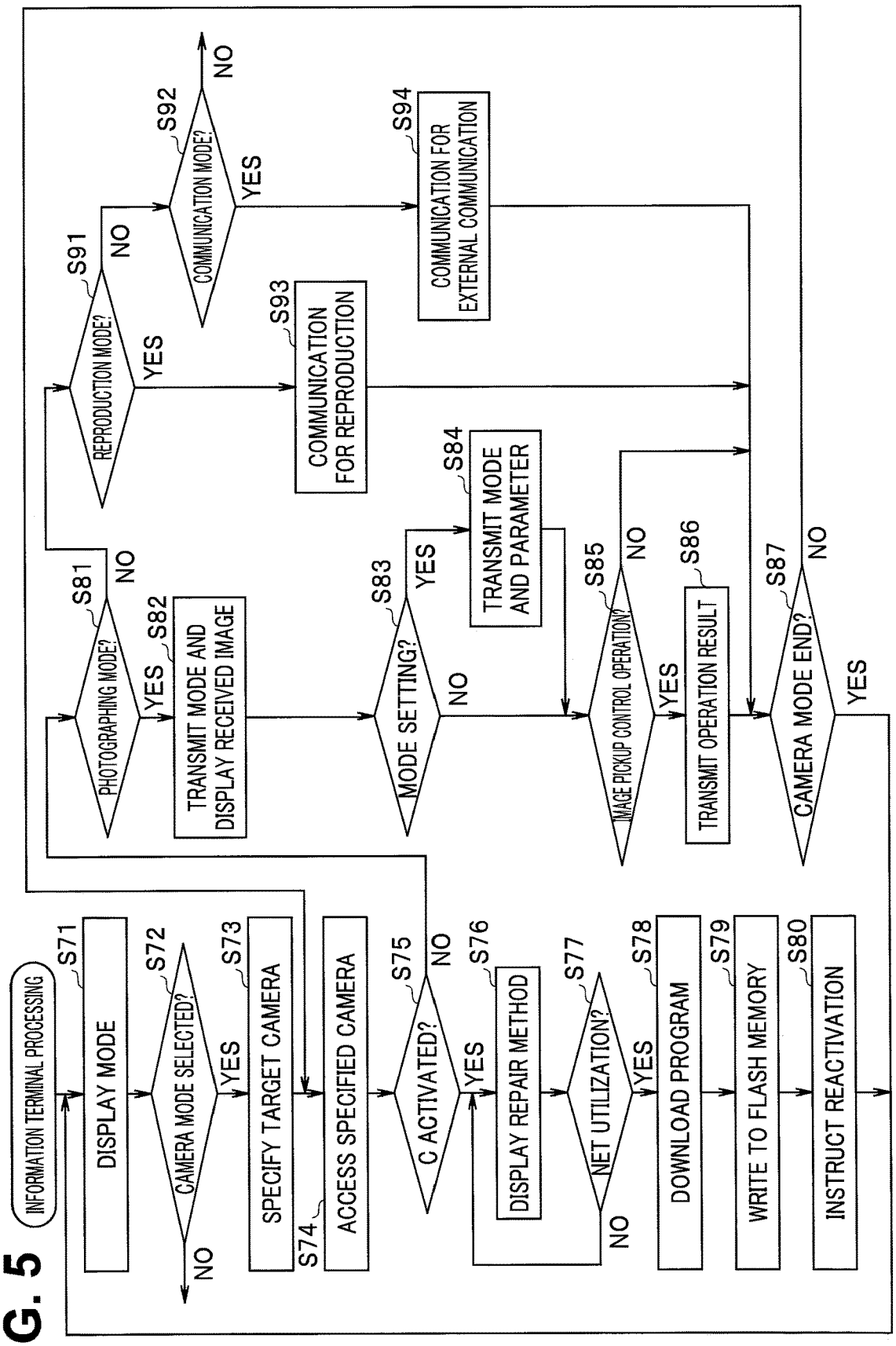
FIG. 5 is a flowchart illustrating a processing flow in an information terminal device 90.

FIG. 5 is a flowchart illustrating a processing flow in the information terminal device 90.

In step S71 in FIG. 5, the control portion 91 displays the mode on a display screen of the display portion 72. Mode display is for setting an operation mode of the information terminal device 90. For example, in the case that the information terminal device 90 is configured by a smartphone or the like, a telephone mode, a mail mode and the like are the operation modes. The control portion 91 determines whether or not a camera mode is selected in step S72. In the case that the operation mode other than the camera mode is selected, the selected operation mode is executed.

When the camera mode is selected, the control portion 91 specifies a target camera according to a target camera selecting operation by a user. The control portion 91 accesses the specified camera. The communication portion 93 is controlled by the control portion 91, accesses the specified camera, and performs the communication with the communication portion 60 of the specified camera. The control portion 91 determines whether or not the C program is activated in the specified camera, based on the information from the control portion 11 of the specified camera (step S75).

As described above, in the photographing device 1, the C program is activated in the case that the B1 or B2 program is not activated. In the case that the B1 or B2 program which is the basic program is activated, the control portion 91 determines whether or not the photographing mode is specified in step S81, and determines whether or not the reproduction mode is specified in step S92. In the case that the photographing mode is specified, the control portion 91 performs mode transmission for specifying the photographing mode in step S82, and displays the picked-up image received from the photographing device 1 on the display screen of the display portion 72. The control portion 91 determines whether or not the setting operation of the mode, the parameter and the like is performed in step S83, and in the case that the operation is performed, in step S84, transmits the mode and parameter information based on the setting operation of the mode and the parameter.

The control portion 91 determines whether or not an image pickup control operation is performed in step S85, and transmits an operation result in step S86. That is, the control portion 91 transmits a command for still image photographing to the photographing device 1 when the still image photographing operation is performed, and transmits a command for moving image photographing to the photographing device 1 when the moving image photographing operation is performed.

When the reproduction mode is specified, the control portion 91 shifts the processing from step S91 to step S93, and performs the communication for the reproduction. In the case that the reproduction mode is not specified, the control portion 91 determines whether or not a communication mode is specified in step S92. In the case that the communication mode is specified, the control portion 91 performs the communication for the external communication in step S94. Note that, in the case of determining that the communication mode is not specified in step S92, the control portion 91 executes the other specified processing.

The control portion 91 determines whether or not an end operation of the camera mode is performed in step S87. In the case that the end operation is not performed, the processing is returned to step S74, and access with the specified camera is continued.

On the other hand, in the case that the B1 or B2 program is not activated and the C program is activated in the photographing device 1, the control portion 91 shifts the processing from step S71 to step S76, and causes a method for repairing the photographing device 1 to be displayed on the display screen of the display portion 72.

Next, the control portion 91 determines whether or not the user has specified the line such as the Internet (net utilization) as the repair method (step S77). When the user specifies the net utilization, the control portion 91 controls the communication portion 93, connects the line such as the Internet, accesses a site for repairing the photographing device 1, and downloads the basic program from the site (step S78). The control portion 91 transfers the downloaded program to the photographing device 1 through the communication portion 93, and causes the program to be stored in the B1 and B2 program areas 31 and 32 of the flash memory 30 of the photographing device 1 (step S79). Then, the control portion 91 supplies the instruction of reactivation to the control portion 11 of the photographing device 1 (step S80).

In this way, in the case that the basic program is not executed and the C program is executed in the photographing device 1, the required program can be downloaded in the information terminal device 90 and written to the flash memory 30 of the photographing device 1. Thus, thereafter, the execution of the main flow by the B1 or B2 program stored in the flash memory 30 becomes possible.

In the embodiment described above, since need of eliminating a failure is high in information acquisition, the photographing device is an example as described above. Of course, since a recorder or the like is also an information acquisition device, application is possible. As a device for photographing, a digital camera is used and described, however, a camera may be a digital single lens reflex camera or a compact digital camera, may be a camera for the moving image such as a video camera or a movie camera, or may be of course a camera built into a personal digital assistant (PDA) such as a portable telephone or a smartphone, further. In addition, it is needless to say that the present application can be effectively utilized widely in an electronic control device such as a portable device, a reproduction device, and an information processing device.

The present invention is not limited as it is to the embodiment described above, and components can be modified and embodied without departing from the scope in an implementation phase. In addition, by an appropriate combination of the plurality of components disclosed in the above-described embodiment, various inventions can be formed. For example, some components of all the components indicated in the embodiment may be deleted.

Note that, regarding an operation flow in the scope of claims, the description and the drawings, even when the description is given using "first," "next," or the like for convenience, it does not mean that it is essential to perform the execution in the order. In addition, it is needless to say that, for the respective steps configuring the operation flow, a part not affecting essence of the invention can be appropriately omitted.

Note that, of the technology described here, the control described mainly in the flowchart can be often set by the program, and is sometimes housed in a recording medium or a recording portion. As a method of recording to the recording medium or the recording portion, recording may be performed when shipping a product, a distributed recording medium may be utilized, or downloading may be performed through the Internet.

What is claimed is:

1. An embedded system comprising:
a first storage portion in which data of a block of memory including a boot program part in at least one instance of a basic program stored in a flash memory is developed and stored;
a second storage portion in which the basic program is developed and stored according to a boot program included in the data of the block of memory including a boot program part developed in the first storage portion;
a first error correction circuit configured to perform error correction when reading the data of the block of memory including the boot program part;
a third storage portion in which information based on an error correction result of the first error correction circuit is stored;
a control portion configured to determine a propriety of refresh processing on the boot program based on the information based on the error correction result stored in the third storage portion; and
a second error correction circuit configured to perform error correction on data read from the flash memory and developed and stored in the second storage portion,
wherein the control portion is operated according to a boot refresh program in the basic program developed in the second storage portion, determines the propriety of the refresh processing according to the information based on the error correction result stored in the third storage portion, and responsive to a determination, using the determined propriety, to perform the refresh processing on the boot program, as the refresh processing on the boot program, reads the data of the block of memory including the boot program part from the flash memory, develops and stores the data in the second storage portion, the developed and stored data being subjected to error correction by the second error correction circuit, and writes back the developed and stored data to the block of memory including the boot program part in the flash memory.

2. The embedded system according to claim 1, wherein the third storage portion is configured by a partial storage area inside the second storage portion.

3. The embedded system according to claim 1, wherein all functions of the embedded system are divided into a basic function and an expanded function, an expansion program configured to realize the expanded function and two instances of the basic program configured to realize the basic function are stored in the flash memory, and
of the two instances of the basic program, one instance of the basic program, for which the error correction is performed by the second error correction circuit, is developed and stored in the second storage portion.

4. The embedded system according to claim 1, wherein the control portion determines the propriety of the refresh processing on the basic program based on the error correction result of the second error correction circuit on the basic program developed and stored in the second storage portion.

5. The embedded system according to claim 1, wherein, in a case of performing the refresh processing for at least one of the boot program and the basic program, the control portion generates a warning indicating that at least one of the boot program and the basic program is subjected to the refresh processing.

6. The embedded system according to claim 1, comprising a fourth storage portion in which a start program for reading the boot program is stored.

7. The embedded system according to claim 1, wherein a repair program for downloading a program from an external device is stored in the flash memory, and
in a case that an instance of the basic program is not developed and stored in the second storage portion, the control portion develops and stores the repair program in the second storage portion and executes the repair program.

8. A photographing device comprising:
an image pickup portion;
a first storage portion in which data of a block of memory including a boot program part in a basic program for image pickup stored in a flash memory is developed and stored;
a second storage portion in which the basic program is developed and stored according to a boot program included in the data of the block of memory including a boot program part developed in the first storage portion;
a first error correction circuit configured to perform error correction when reading the data of the block of memory including the boot program part;
a third storage portion in which information based on an error correction result of the first error correction circuit is stored;
a control portion configured to determine a propriety of refresh processing on the boot program based on the information based on the error correction result stored in the third storage portion; and a second error correction circuit configured to perform error correction on data read from the flash memory and developed and stored in the second storage portion, wherein the control portion is operated according to a boot refresh program in the basic program developed in the second storage portion, determines the propriety of the refresh processing according to the information based on the error correction result of the first error correction circuit, and responsive to a determination, using the determined propriety, to perform the refresh processing on the boot program, as the refresh processing on the boot program reads the data of the block of memory including the boot program part from the flash memory, develops and stores the data in the second storage portion, the developed and stored data being subjected to error correction by the second error correction circuit, and writes back the developed and stored data to the block of memory including the boot program part in the flash memory.

9. A refresh method comprising:

developing data of a block of memory including a boot program part in at least one instance of a basic program stored in a flash memory and storing the data of the block of memory including the boot program part in a first storage portion;

developing and storing, according to a boot program included in the data of the block of memory including a boot program part developed in the first storage portion, the basic program in a second storage portion;

performing, using a first error correction circuit, first error correction processing when reading the data of the block of memory including the boot program part;

storing information based on an error correction result in the first error correction processing in a third storage portion;

determining a propriety of refresh processing on the boot program based on the information based on the error correction result stored in the third storage portion;

performing, using a second error correction circuit, error correction on data read from the flash memory and developed and stored in the second storage portion;

operating a control portion according to a boot refresh program in the basic program developed in the second storage portion, to determine the propriety of the refresh processing according to the information based on the error correction result stored in the third storage portion, and responsive to a determination, using the propriety, to perform the refresh processing on the boot program, as the refresh processing on the boot program, read the data of the block of memory including the boot program part from the flash memory, develop and store the data in the second storage portion, the developed and stored data being subjected to error correction by the second error correction circuit, and write back the developed and stored data to the block of memory including the boot program part in the flash memory.

10. The embedded system according to claim 1, wherein the block of memory including the boot program part is a leading block in the basic program stored in the flash memory.

11. The photographing device according to claim 8, wherein the block of memory including the boot program part is a leading block in the basic program stored in the flash memory.

\* \* \* \* \*